United States Patent
Bash et al.

(10) Patent No.: US 6,415,619 B1
(45) Date of Patent: Jul. 9, 2002

(54) MULTI-LOAD REFRIGERATION SYSTEM WITH MULTIPLE PARALLEL EVAPORATORS

(75) Inventors: Cullen E. Bash, San Francisco; Abdlmonem H Beitelmal, Santa Clara; Ratnesh Sharma, Union City, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/801,909

(22) Filed: Mar. 9, 2001

(51) Int. Cl.⁷ .......................... F25B 49/00; F25B 41/04; F25B 41/06; F25D 23/12
(52) U.S. Cl. .......................... 62/228.4; 62/259.2; 62/205; 62/527
(58) Field of Search ....................... 62/228.4, 259.2, 62/204, 205, 527

(56) References Cited

U.S. PATENT DOCUMENTS

| | | | | |
|---|---|---|---|---|
| 2,387,604 A | * | 10/1945 | Newton | 62/228.4 |
| 3,334,684 A | * | 8/1967 | Roush et al. | 62/259.2 |
| 5,074,120 A | * | 12/1991 | Kitamoto | 62/156 |
| 5,142,877 A | * | 9/1992 | Shimizu | 62/129 |
| 5,222,371 A | * | 6/1993 | Doyama et al. | 62/204 |
| 5,600,962 A | * | 2/1997 | Aizawa et al. | 62/204 |
| 5,737,931 A | * | 4/1998 | Ueno et al. | 62/126 |
| 6,205,796 B1 | * | 3/2001 | Chu et al. | 62/94 |
| 6,205,803 B1 | * | 3/2001 | Scaringe | 62/259.2 |

* cited by examiner

Primary Examiner—William C. Doerrler

(57) ABSTRACT

System and method for reducing temperature variation among heat dissipating components in a multi-component computer system. In this respect, component temperatures are controlled to remain relatively constant (approximately within 5° C.) with respect to other components, while allowing for multiple fluctuating heat loads between components. A refrigeration system possessing a variable speed compressor or a constant speed compressor is utilized to control the flow of refrigerant through the refrigeration system. The temperature variation among components is reduced by independently metering the mass flow rate of the refrigerant flowing into each component to compensate for the amount of heat load on each component. In this respect, the mass flow rate of the refrigerant entering into each of the evaporators is metered by valves located upstream from each of the evaporators. In another respect, the mass flow rate is metered by the above-described valves and a main valve provided on a secondary refrigerant line.

21 Claims, 6 Drawing Sheets

MULTI-LOAD REFRIGERATION SYSTEM WITH MULTIPLE PARALLEL EVAPORATORS

FIELD OF THE INVENTION

This invention relates generally to a system for reducing the temperature of components in a computer system. More particularly, the invention pertains to a refrigeration system having multiple evaporators connected in parallel for receiving individually metered amounts of refrigerant to thus reduce temperature variation among components in a multi-component system.

BACKGROUND OF THE INVENTION

The components (e.g., processors, micro-controllers, high speed video cards, disk drives, semi-conductor devices, etc.) of a computer system are generally known to generate rather significant amounts of heat. It has been found that the performance and reliability of the components typically deteriorate as the temperature of the components increase. Computer systems are thus generally equipped with a mechanism (e.g., a fan) attached to a housing of the computer system to cool the components by cooling the interior space of the computer system. Although these types of mechanisms have been relatively effective in cooling the components of certain types of computer systems, they have been found to be relatively insufficient to cool the faster and more powerful components of today's computers.

With the advent of faster and more powerful processors, the possibility that the processors will overheat has drastically increased. One solution to the overheating problem has been to directly cool the components themselves through the use of refrigeration systems. Refrigeration systems generally possess an evaporator positioned in thermal contact with a surface of the component to be cooled. Although refrigeration systems have been found to be relatively effective in maintaining the temperatures of individual computer components within acceptable ranges, it has been found that known refrigeration systems suffer from a variety of drawbacks and disadvantages when a computer system possesses a number of components ("multi-component system").

For instance, one known technique of reducing the temperature of a multi-component system is to rely upon a single refrigeration system possessing a plurality of evaporators aligned in series along each of the components. That is, the evaporators are connected along a single refrigerant line such that refrigerant flows from one evaporator to the next. In this respect, the amount of refrigerant flowing into each of the evaporators is the same for each of the evaporators. Thus, known serially positioned evaporators do not allow for individual metering of refrigerant flow through each evaporator. As a consequence, evaporators positioned downstream from other evaporators may be adversely affected (e.g., downstream evaporators may receive superheated fluid which may actually cause a rise in their temperature). In addition, evaporators positioned relatively upstream and having lower power dissipation, may actually be cooler than the downstream evaporators.

An additional problem associated with known multi-load refrigeration systems arises from the fact that the flow rate through each of the evaporators is the same. In this respect, components producing a greater amount of heat will require a greater amount of refrigerant than components producing a relatively lesser amount of heat. This may cause the refrigerant to remain in liquid form as it enters the compressor. One possible effect of having liquid refrigerant enter into the compressor is that slugging may occur, which may ruin or otherwise damage the compressor.

Another manner of reducing the temperature of processors may include the provision of a separate refrigeration system for each component in a multi-component system. Although such a system may overcome some of the difficulties of serially positioned evaporators, the cost and space requirements involved with this type of system would be relatively substantial and thus may not be a viable technique for cooling the components.

SUMMARY OF THE INVENTION

According to the principles of the present invention, a refrigeration system is configured to allow for the mass flow rate of refrigerant flowing into the evaporators of a multi-load refrigeration system to be independently metered to thereby separately control the amount of heat dissipated by each of the evaporators, without suffering from the drawbacks and disadvantages associated with known refrigeration systems.

According to a preferred embodiment, the present invention relates to a refrigeration system for cooling a plurality of components in a computer system. The refrigeration system includes a compressor for controlling the flow of refrigerant through a refrigerant line and a plurality of evaporators configured to receive the refrigerant flowing from the compressor. The evaporators are configured for thermal attachment to the plurality of components, and the flow of the refrigerant into each of the evaporators is independently metered.

Additionally, the present invention pertains to a method for cooling multiple components of a computer system having multiple fluctuating heat loads. According to the method, a flow of refrigerant through a refrigeration system having a variable speed compressor is controlled. The refrigeration system includes a plurality of evaporators and a plurality of valves, each valve being configured to control the flow of the refrigerant through a respective evaporator. A saturation temperature of the refrigerant is sensed and the speed of a compressor is modified in response to the saturation temperature being outside a predetermined saturation temperature range.

In accordance with another preferred embodiment, the present invention relates to a method for cooling multiple components of a computer system having multiple fluctuating heat loads. According to the method, a flow of refrigerant through a refrigerant line in a refrigeration system having a constant speed compressor is controlled. The refrigeration system further includes a plurality of evaporators and a plurality of valves, each of the valves is configured to meter the flow of the refrigerant through a respective evaporator. A superheat temperature of the refrigerant flowing through each of said evaporators is checked. Each of the respective valves for the evaporators in which the evaporator superheat temperature is less than an evaporator superheat temperature set point is manipulated to decrease the flow of refrigerant therethrough. A processor temperature is sensed for those evaporators in which the evaporator superheat temperature exceeds or is equal to the evaporator superheat temperature set point.

BRIEF DESCRIPTION OF THE DRAWINGS

Features and advantages of the present invention will become apparent to those skilled in the art from the following description with reference to the drawings, in which.

DETAILED DESCRIPTION OF THE INVENTION

For simplicity and illustrative purposes, the principles of the present invention are described by referring mainly to exemplary embodiments thereof, particularly with references to a computer system possessing multiple processors. However, one of ordinary skill in the art would readily recognize that the same principles are equally applicable to, and can be implemented in, a computer system possessing multiple processors and other heat producing components and any device that may benefit from multiple evaporators arranged in parallel, and that any such variation would be within such modifications that do not depart from the true spirit and scope of the present invention. Thus, although the present invention is described with particular reference to processors, it will be apparent to one of ordinary skill in the art that the present invention may be practiced with any other suitable heat dissipating component.

In accordance with the principles of the present invention, temperature variation among processors in a multi-processor system may be reduced through the use of a refrigeration system (e.g., a vapor compression refrigeration system). In this respect, processor temperatures may be controlled to remain relatively constant (approximately within 5° C.) with respect to other processors, while allowing for multiple fluctuating heat loads among the processors. That is, according to the principles of the present invention, the mass flow rate of refrigerant flowing into each evaporator attached to a processor is independently metered to compensate for the amount of heat load for each processor while the temperature of refrigerant entering each evaporator is substantially equal.

Figure 1:
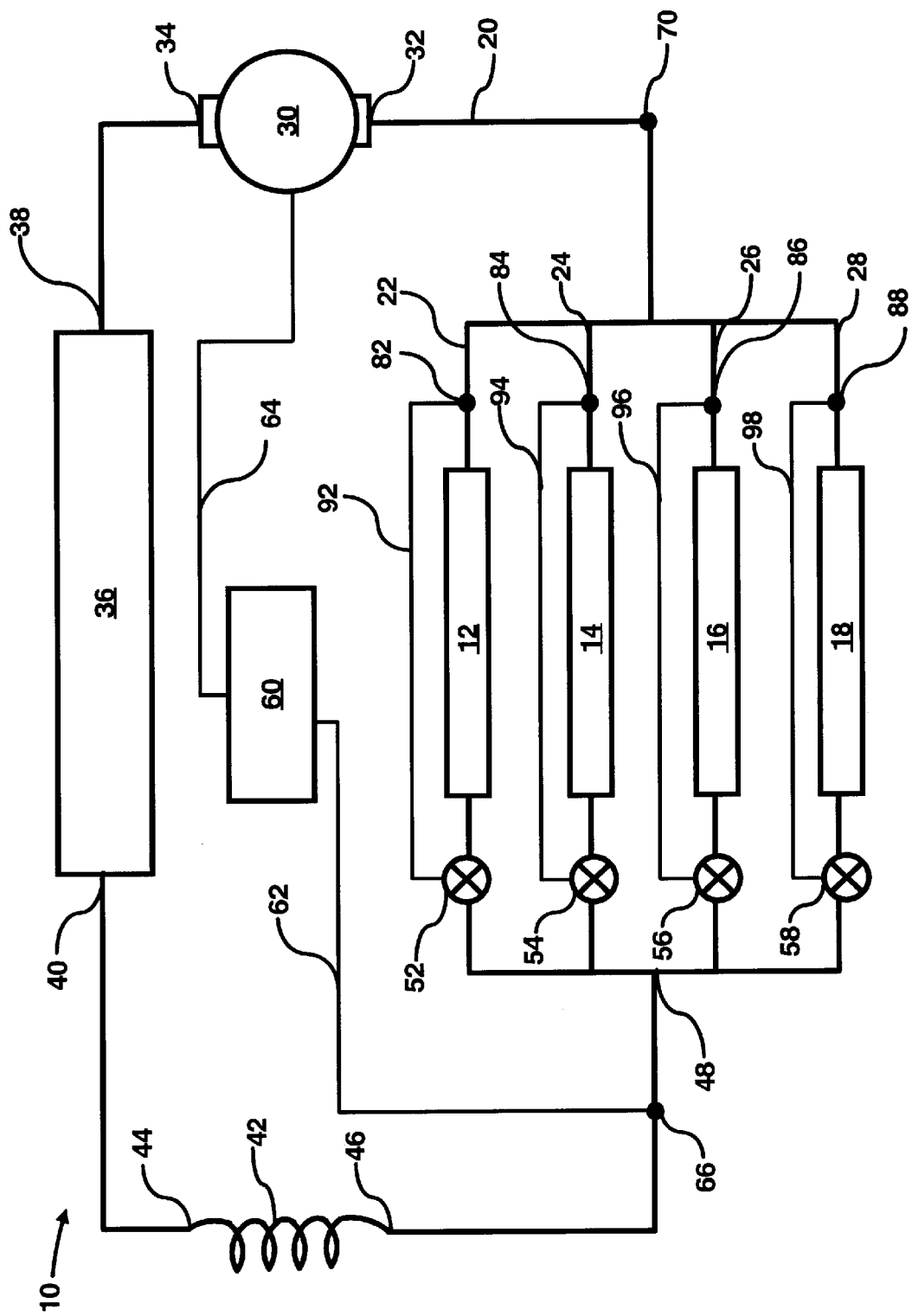
FIG. 1 illustrates a refrigeration system for cooling components of a computer system in which a plurality of evaporators are positioned in a parallel configuration in accordance with an embodiment of the present invention.
Figure 3:
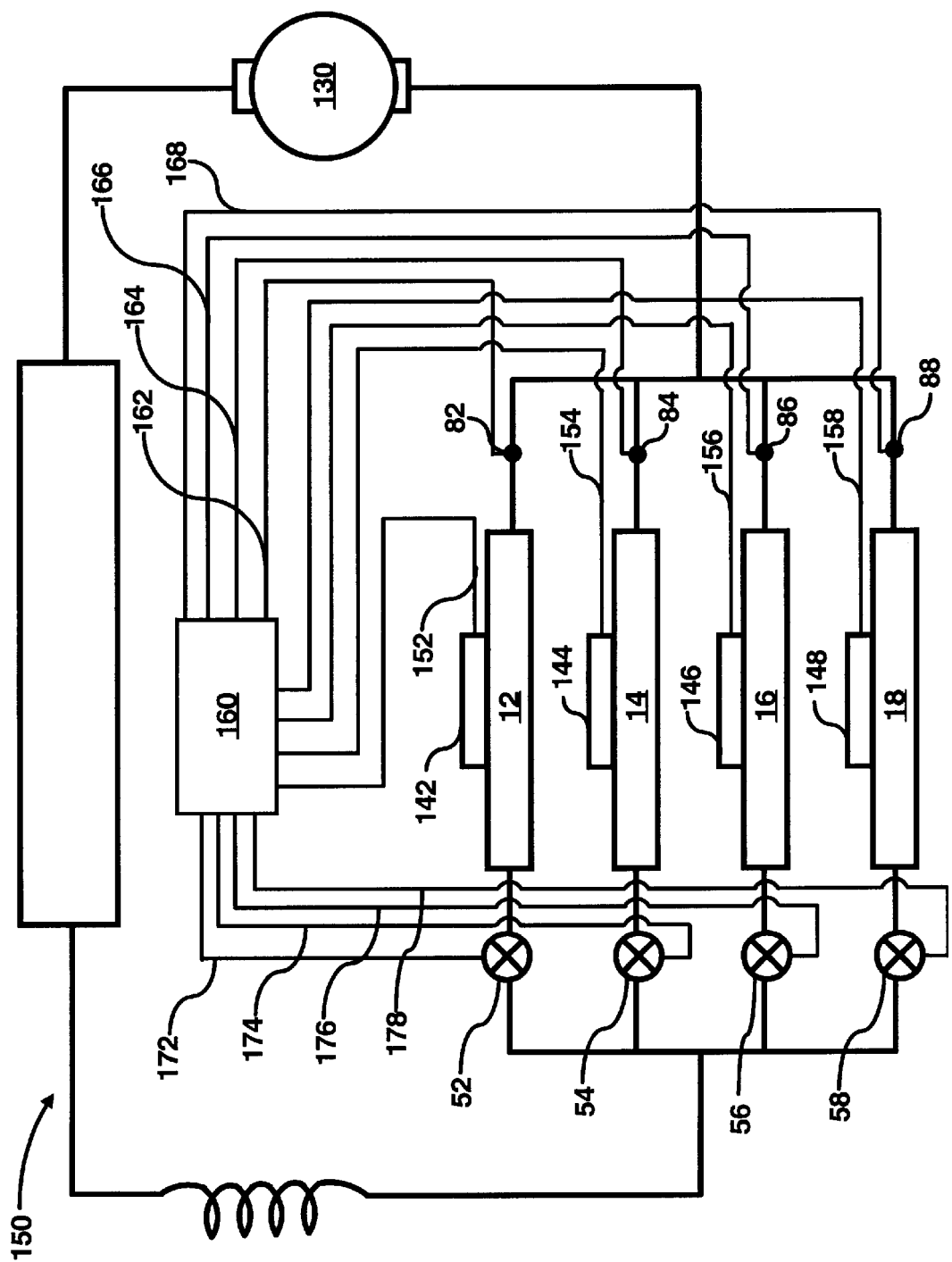
FIG. 3 illustrates a refrigeration system for cooling components of a computer system in accordance with another embodiment of the present invention.
Figure 5:
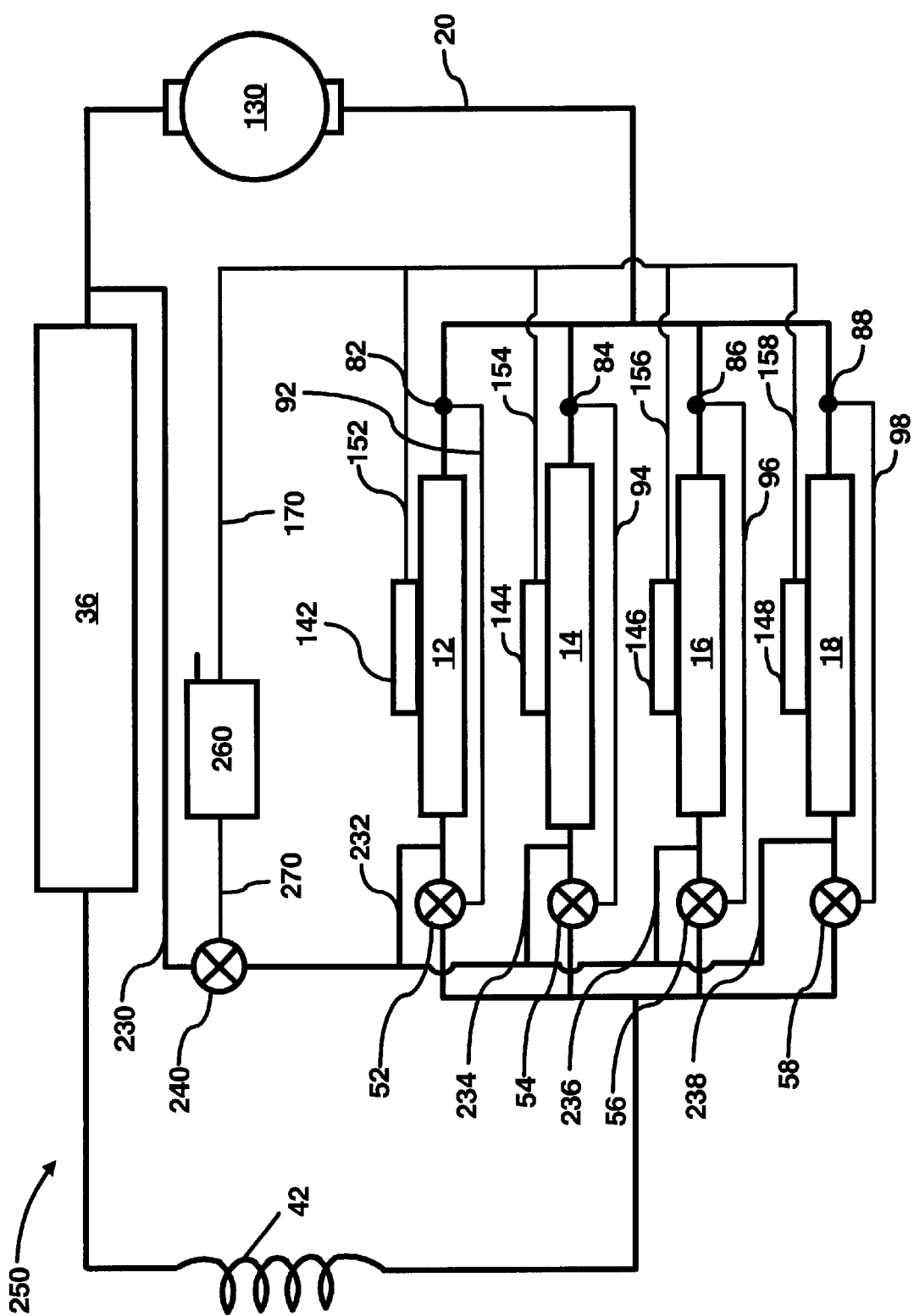
FIG. 5 illustrates a refrigeration system for cooling components of a computer system in accordance with yet another embodiment of the present invention.

In FIGS. 1, 3, and 5, multi-load refrigeration systems 10, 150, 250 are illustrated as including a plurality of evaporators 12, 14, 16, 18 (e.g., cold plates) which are connected in a parallel fashion to one another to cool multiple processors (not shown) in a computer system. Multi-load refrigeration systems, as referenced throughout the present disclosure, generally refer to refrigeration systems having a plurality of evaporators for cooling multiple heat loads generated by multiple processors. Because the specific type of evaporator to be used in the present invention will vary according to individual needs, the present invention is not limited to any specific type of evaporator and may thus utilize any type of evaporator which may reasonably accomplish the goals of the present invention. Examples of suitable evaporators employable in the present invention are available from LYTRON, Inc. of Woburn, Mass. and THERMOTEK Co., LTD. of Texas and South Korea. However, as is readily apparent to those of ordinary skill in the art, other suitable evaporators may be used in the present invention without departing from the scope and spirit of the present invention.

Additionally, although FIGS. 1, 3, and 5, each depict four evaporators, it is to be understood that the present invention is not limited to four evaporators, but rather, the present invention may include any reasonable number of evaporators. In one respect, the number of evaporators may correspond to the number heat dissipating processors. Accordingly, the four evaporators depicted in FIGS. 1, 3, and 5 are for illustrative purposes only and thus is not meant to limit the present invention in any respect. Additionally, as is well known to those having ordinary skill in the art, the term "parallel" describes the manner in which a single conduit is separated into a plurality of conduits, such that, the flow of refrigerant through each of the conduits may be independently controlled.

Referring to FIGS. 1, 3, and 5, the multi-load refrigeration systems 10, 150, and 250 each possesses a closed loop for refrigerant to flow to and from the processors of the refrigeration systems. The refrigeration systems 10, 150, 250 each includes a plurality of evaporators 12–18, a compressor 30, a condenser 36, and an expansion valve 42. The condenser 36 and the expansion valve 42 of the present invention may include any number of known or heretofore known condensers and expansion valves and thus includes any type of condenser and expansion valve which substantially adequately performs their respective functions within a refrigeration system. Examples of expansion valves suitable for use with the present invention include capillary tubes, constant pressure expansion valves, and the like.

Additionally, any suitable type of refrigerant may be utilized in the present invention. In fact, the choice of refrigerant will depend upon a plurality of factors, e.g., cooling requirements, environmental impact, cost, etc. Generally speaking, suitable refrigerants include the suite of vapor compression hydrocarbon refrigerants (CFCs, HCFSs, HFCs or any blend of pure refrigerants). Specific examples of suitable refrigerants include R134a, R290, R600, etc. Moreover, suitable refrigerants may be obtained from any commercial refrigerant manufacturer (e.g., TONG TAI INTERNATIONAL located in Taiwan, R.O.C.).

According to the preferred embodiment illustrated in FIG. 1, the compressor 30 is a variable speed compressor. In other words, the compressor 30 may be controlled to either increase or decrease the mass flow rate of the refrigerant therethrough. According to the principles of the present invention, a number of different types of variable speed compressors may be utilized for proper operation of the present invention. Thus, in similar fashion to other types of vapor compression refrigeration systems, the refrigerant flowing through the refrigerant line 20 changes between a gas and a liquid at various positions as the refrigerant circuits the closed loop of the refrigeration system 10.

Although not specifically shown in FIG. 1, the evaporators 12–18 are configured to be attached to respective processors by any known means which allows for adequate thermal transfer from the processors to the evaporators.

In operation, refrigerant flowing into each of the evaporators 12–18 is individually metered. In one respect, the mass flow rate of the refrigerant flowing into each of the evaporators 12–18 is generally dependent upon the amount of heat produced by a respective processor. That is, because the level of cooling of the processors depends upon the amount of refrigerant flowing into the evaporators 12–18, the mass flow rate of the refrigerant is metered to allow a controlled amount of refrigerant to enter into the respective evaporators. Additionally, according to a preferred embodiment of the invention, the evaporators 12–18 only receive a relatively necessary amount of refrigerant to adequately cool each respective processor without allowing any significant amount of liquid refrigerant to flow into the compressor 30. In this respect, evaporators attached to processors producing relatively less heat than other processors may receive relatively less refrigerant. Thus, the temperatures of the processors in a multi-processor system may be maintained at a relatively constant temperature to thereby reduce any temperature variation among the processors.

Referring again to FIG. 1, refrigerant enters the variable speed compressor 30 through a compressor inlet 32. The variable speed compressor 30 increases the pressure and temperature of the refrigerant before the refrigerant exits through a compressor outlet 34. The speed of the compressor 30 and thus the level of compression of the refrigerant may be controlled by a proportional, integral, derivative controller with relay ("PID") 60. The manner in which the compression level is controlled by altering compressor speed will be discussed in greater detail hereinbelow.

The refrigerant thus flows out of the compressor 30 and through the refrigerant line 20 into the condenser 36 through a condenser inlet 38. Within the condenser 36, the refrigerant begins to decrease in temperature while remaining at a constant pressure until the refrigerant reaches a saturation point. The refrigerant exits the condenser 36 through a condenser outlet 40, typically as a liquid (still at a relatively high pressure and temperature). The refrigerant then flows through the refrigerant line 20 into the expansion valve 42 through an expansion valve inlet 44. The pressure of the refrigerant is reduced within the expansion valve 42.

After exiting the expansion valve 42 through an expansion valve outlet 44, the refrigerant flows past a sensor 66 which measures the evaporator saturation temperature ("$T_{sat}$") of the refrigerant. Although any suitable type of temperature sensor may be utilized in the present invention, examples of suitable temperature sensors include a thermocouple, thermistor, pressure sensing device if the refrigerant is azeotropic (i.e., evaporator saturation temperature is constant over phase change), and the like. The sensor 66 is connected to the PID 60 via an input line 62. The PID 60 is also connected to the variable speed compressor 30 via an output line 64. The PID 60 is configured to control the speed of the compressor and thus the level of compression the variable speed compressor 30 applies on the refrigerant based upon the measured $T_{sat}$ to thereby control the mass flow rate of the refrigerant throughout the refrigeration system 10. Although any suitable PID may be utilized with the present invention, examples of suitable PIDs include those manufactured by OMEGA Inc. of Stamford, Connecticut, and WATLOW ELECTRIC MANUFACTURING CO. of St. Louis, Mo. The refrigerant then flows through the refrigerant line 20 and is separated into four evaporator refrigerant lines 22–28 at a junction 46. The evaporator refrigerant lines 22–28 lead the refrigerant through the evaporators 12–18.

As illustrated in FIG. 1, evaporator valves 52–58 are provided upstream of respective evaporators 12–18 to individually meter the flow of refrigerant into each of the evaporators. It is to be understood that a specific type of evaporator valve is not required to be utilized with the present invention, but rather, any suitable type of controllable metering valve, e.g., a thermal electric valve, may be utilized. An example of a suitable evaporator valve employable in the present invention includes the 625 Series Valves manufactured by PARKER-HANNWIN CORP. of Cleveland, Ohio.

As further illustrated in FIG. 1, sensors 82–88 (e.g., thermocouples, thermistors, pressure sensing devices, etc.) are positioned downstream of respective evaporators 12–18. The sensors 82–88 are configured to measure the temperature of the refrigerant ("$T_{evap,out}$") as it exits the respective evaporators 12–18. The evaporator valves 52–58 respond to changes in the $T_{evap,out}$ to meter the flow of the refrigerant into each of the evaporators 12–18. In one respect, a change in the $T_{evap,out}$ may cause a bimetallic strip inside the evaporator valve 52–58 to actuate thus manipulating the evaporator valve to vary the flow of refrigerant into the respective evaporators 12–18. The change in temperature may be relayed to the evaporator valves 52–58 via respective temperature signal lines 92–98. After the refrigerant exits the evaporators 12–18, the refrigerant is once again introduced back into the refrigerant line 20 such that the entire refrigeration process may be repeated. In addition, a sensor 70 (e.g., thermocouple, thermistor, pressure sensing device, etc.) is provided between the evaporators 12–18 and the variable speed compressor 30 so that the suction temperature ("$T_{suction}$") may be measured.

Figure 2:
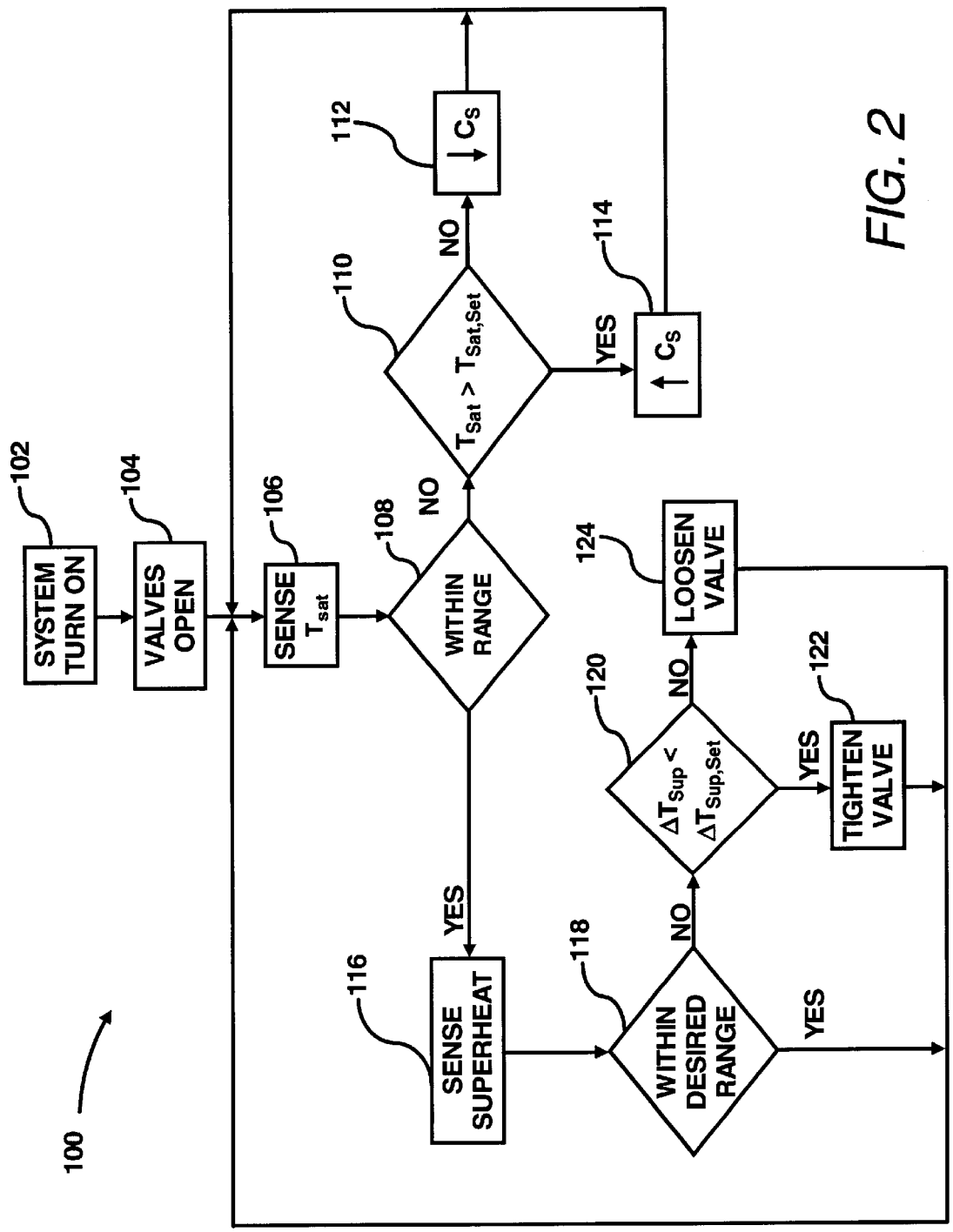
FIG. 2 is a flow chart depicting a manner in which the embodiment illustrated in FIG. 1 may be practiced.

FIG. 2 is a flow diagram 100 depicting a manner in which the embodiment illustrated in FIG. 1 may be practiced. Accordingly, the following description of FIG. 2 will be made with particular reference to those features illustrated in FIG. 1. As seen in FIG. 2, after the refrigeration system 10 is turned on at step 102, the evaporator valves 52–58 are opened at step 104. As the refrigerant begins to flow through the refrigeration system 10, the $T_{sat}$ is measured at step 106. The $T_{sat}$ measurement is then relayed to the PID 60 via the input line 62 where it is then compared to a predetermined range at step 108. The predetermined range in step 108 is determined based upon system design and the amount of load variability to be expected among the processors. In general, the predetermined range may depend upon the following: electrical timing requirements, allowable mechanical stress due to thermal expansion, proximity to dew point, etc. If it is determined that the $T_{sat}$ is not within the predetermined range, it is then determined whether the $T_{sat}$ is higher than an evaporator saturation temperature set point ("$T_{sat,set}$") at step 110. The $T_{sat,set}$ may be determined by determining the optimum operating temperature of each processor and is a function of processor design, processor packaging, the efficiency of the thermal connection between the evaporator and processor, the design of the evaporator, flow rate of the refrigerant, refrigerant properties, and the like.

If the $T_{sat}$ is equal to or below the $T_{sat,set}$, the speed of the variable speed compressor 30 is reduced by a controlled amount at step 112. By reducing the speed of the variable speed compressor 30, the mass flow rate of the refrigerant entering into the evaporators 12–18 will be decreased and the $T_{sat}$ will be increased. If, on the other hand, the $T_{sat}$ is higher than the $T_{sat,set}$, the speed of the variable speed compressor 30 is increased by a controlled amount at step 114. Increasing the speed of the variable speed compressor 30 has the effect of increasing the mass flow rate of the refrigerant entering into the evaporators while reducing the $T_{sat}$. After each of steps 112 and 114, the $T_{sat}$ is measured once again and the process is repeated.

If the $T_{sat}$ is determined to be within the desired range, the evaporator superheat temperature ("$\Delta T_{sup}$") for each of the evaporators 12–18 is sensed by the respective sensors 82–88 at step 116. At step 118, it is determined whether the $\Delta T_{sup}$ for each of the evaporators is 12–18 is within a predetermined desired range. If the $\Delta T_{sup}$ for one of the evaporators (e.g., evaporator 12) is within the desired range, then no change is made to the evaporator valve (e.g., valve 52) of that evaporator. However, if the $\Delta T_{sup}$ is not within the desired range for any of the evaporators 12–18, the $\Delta T_{sup}$ for that evaporator is compared to an evaporator superheat set point ("$\Delta T_{sup,set}$") at step 120. The $\Delta T_{sup,set}$ for each of the evaporators 12–18 is about between 0–5° C. and may be set to be approximately the same for each of the evaporators.

Thus, for example, if the $\Delta T_{sup}$ for one evaporator (e.g., evaporator 12) is lower than the $\Delta T_{sup,set}$ for that evaporator (e.g., evaporator 12), the evaporator valve for that evaporator (e.g., valve 52) is manipulated by a controlled amount to decrease the mass flow rate of the refrigerant flowing into the evaporator (e.g., evaporator 12) at step 122. In addition, by manipulating the evaporator valve (e.g., valve 52) to reduce the mass flow of the refrigerant through the evaporator (e.g., 12), the $T_{sup}$ may be increased and the $T_{sat}$ may be reduced.

If, on the other hand, the $\Delta T_{sup}$ for one evaporator (e.g., evaporator 12) is not less than the $\Delta T_{sup,set}$ for that evaporator (e.g., evaporator 12), the evaporator valve (e.g., 52) for that evaporator is manipulated to increase the mass flow of the refrigerant therethrough by a controlled amount as indicated at step 124. By way of increasing the mass flow rate of the refrigerant through that evaporator (e.g., evaporator 12), the $T_{sup}$ may decrease and the $T_{sat}$ may increase. After the evaporator valves 52–58 have been manipulated to either increase or decrease the flow of refrigerant therethrough, the process beginning with step 106 is repeated.

It is to be understood that the above-description of a preferred embodiment of the present invention made specific reference to evaporator 12 for illustrative purposes only and that the manner in which evaporator 12 may be manipulated is equally applicable to the other evaporators 14–18. Additionally, it is to be understood that by way of the principles of the present invention, each of the evaporators 12–18 may be independently metered. More specifically, any one or all of the evaporator valves 52–58 may be manipulated to decrease the flow of refrigerant therethrough while another one of the evaporator valves is manipulated to increase the flow of refrigerant therethrough.

Thus, although specific reference is made to the manner of controlling one evaporator 12 and one evaporator valve 52, it is to be understood that steps 116–124 are carried out for each of the evaporators 12–18, independently of one another and may be done so simultaneously.

FIG. 3 illustrates a second preferred embodiment incorporating the principles of the present invention. The refrigeration system 150 of the second embodiment is similar to the refrigeration system 10 described hereinabove and thus only those features which are reasonably necessary for a complete understanding of the second embodiment is described hereinbelow. Two differences from the refrigeration system 10 are that refrigeration system 150 includes a constant speed compressor 130 and a programmable logic controller ("PLC") 160. The refrigeration system 150, according to the principles of the second preferred embodiment, also includes a plurality of third temperature signal lines 162–168 connected to respective sensors 82–88 for relaying evaporator superheat temperature readings from the sensors to the PLC 160. Moreover, a plurality of control signal lines 172–178 are connected from the PLC 160 to the respective evaporator valves 52–58.

In addition, FIG. 3 depicts the processors 142–148 to be cooled and shows that each of the processors 142–148 are in communication with the PLC 160 via a first set of temperature signal lines 152–158. In this respect, according to the principles of the embodiment illustrated in FIG. 3, the temperatures of the processors 142–148 may be directly relayed to the PLC 160. However, it is within the purview of the present disclosure that the temperature of the processors 142–148 may be measured by any reasonable means including the adjusted temperature measurement of a cold plate. Such a modification to the position of temperature measurement may be accomplished without deviating from the scope and spirit of the present invention.

Figure 4:
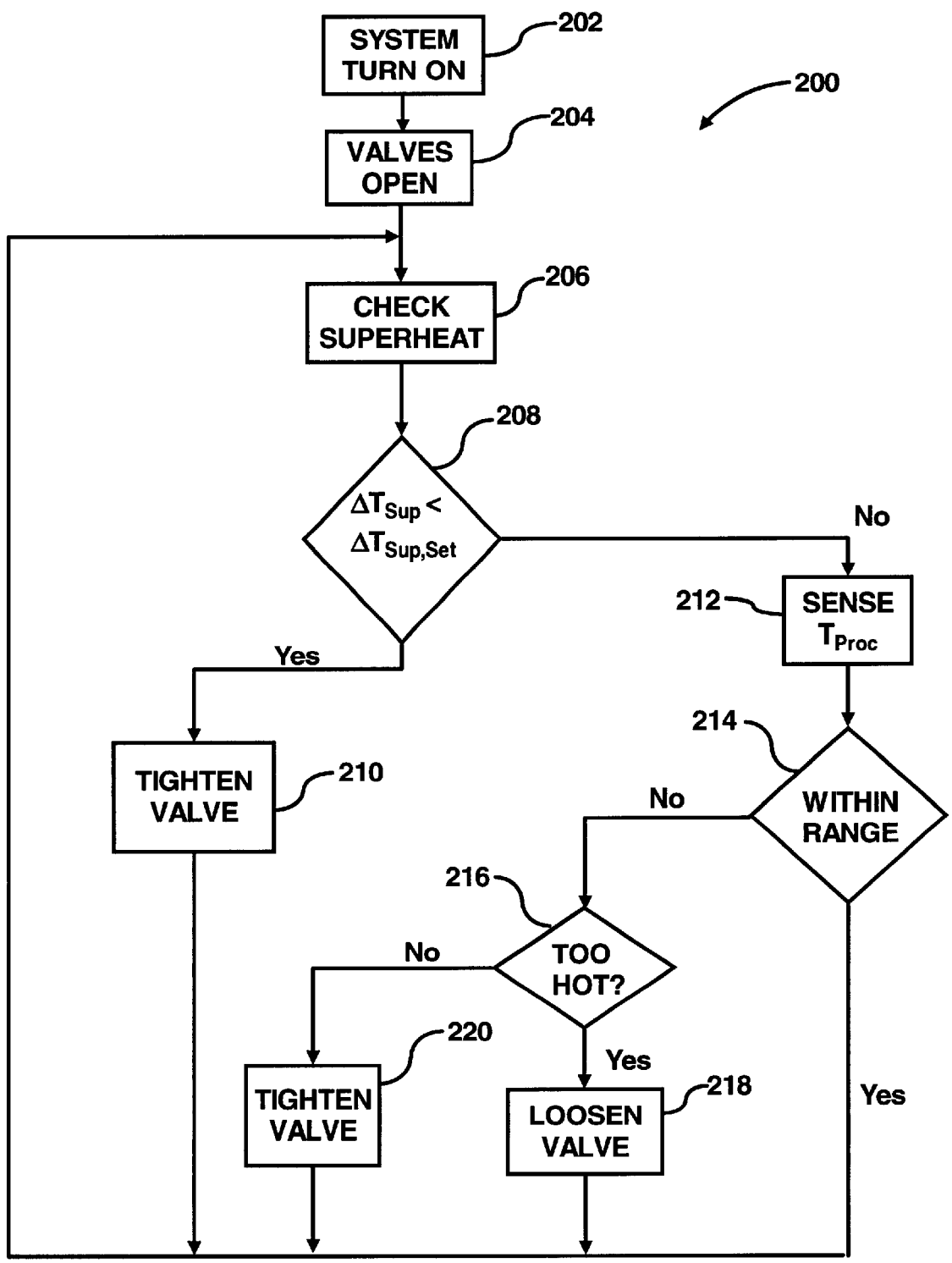
FIG. 4 is a flow chart depicting a manner in which the embodiment illustrated in FIG. 3 may be practiced.

FIG. 4 is a flow diagram 200 depicting a manner in which the embodiment illustrated in FIG. 3 may be practiced. Accordingly, the following description of FIG. 4 will be made with particular reference to the features illustrated in FIG. 3. As seen in FIG. 4, after the refrigeration system 150 is turned on at step 102, the evaporator valves 52–58 are opened at step 204. As the refrigerant begins to flow through the system 150, the $\Delta T_{sup}$ for each of the evaporators 12–18 is sensed by respective sensors 82–88 at step 206. At step 208, the $\Delta T_{sup}$ for each of the evaporators 12–18 is compared to a $\Delta T_{sup,set}$. The $\Delta T_{sup,set}$ for each of the evaporators 12–18 is about between 0–5° C. and may be set to vary among the evaporators.

For illustrative purposes only, the following example is made with particular reference to one evaporator 12 and its related components. It is to be understood that each of the following steps are equally applicable to the other evaporators 14–18 and their relative components, and the steps may be carried out on the other evaporators 14–18 concurrently with the steps described hereinbelow with respect to the evaporator 12.

Thus, for example, if the $\Delta T_{sup}$ for the evaporator 12 is lower than the $\Delta T_{sup,set}$ for that evaporator, evaporator valve 52 is manipulated to decrease the mass flow rate of refrigerant therethrough by a controlled amount at step 210. By decreasing the mass flow rate of refrigerant through the evaporator valve 52, the $T_{sat}$ may be reduced, while the $\Delta T_{sup}$ and the processor temperature or adjusted cold plate temperature ("$T_{proc}$") may be increased. After the mass flow rate of the refrigerant through the evaporator valve 52 has been reduced, the $\Delta T_{sup}$ for each of the evaporators is checked again at step 206

If, on the other hand, the $\Delta T_{sup}$ for the evaporator 12 is not less than the $\Delta T_{sup,set}$ for that evaporator, the $T_{proc}$ is sensed (e.g., with a thermocouple) at 212. The temperature of the processor 142 is relayed to the PLC 160 via temperature signal lines 152 and 170. It is then determined whether the $T_{proc}$ is within a predetermined range at step 214. The predetermined range in step 214 is determined based upon system design and the amount of load variability expected among the processors. In general, the predetermined range may depend upon the following: electrical timing requirements, allowable mechanical stress due to thermal expansion, proximity to dew point, etc. If the $T_{proc}$ is within the predetermined range, the amount of refrigerant flowing through the evaporator valve 52 is unchanged and the superheat temperature is checked again at step 206.

If the $T_{proc}$ is outside the predetermined range, the $T_{proc}$ is compared to a set point temperature to determine whether the $T_{proc}$ is too hot at step 216. The set point temperature is a preferable operating temperature of the component and is generally provided by the component manufacturer. The preferable operating temperature is normally determined based upon the wafer manufacturing process, yield, frequency, etc. If the $T_{proc}$ is too hot, then the PLC 160 sends a signal via control signal line 172 to the evaporator valve 52 instructing the valve increase the mass flow rate of refrigerant therethrough by a controlled amount at step 218.

By increasing the mass flow rate of the refrigerant flowing into the evaporator 12, the $T_{sat}$ may be increased, while the $T_{proc}$ and the $\Delta T_{sup}$ may be decreased.

If the $T_{proc}$ is not too hot, the PLC 160 sends a signal via control signal line 172 to evaporator valve 52 instructing the valve to decrease the mass flow rate of refrigerant therethrough by a controlled amount at step 220. By decreasing the mass flow rate of the refrigerant flowing into the evaporator 12, the $T_{sat}$ may be decreased, while the $T_{proc}$ and the $\Delta T_{sup}$ may be increased. After these measures have been taken, the $\Delta T_{sup}$ is checked again at step 206.

According to the principles of the second preferred embodiment, the amount of refrigerant flowing into each of the evaporators 12–18 may be independently metered by the evaporator valves 52–58. Thus, the temperature of the processors 142–148 may be controlled according to the superheat temperature of the refrigerant flowing out of the evaporators.

FIG. 5 illustrates a third preferred embodiment incorporating the principles of the present invention. The refrigeration system 250 of the third embodiment is similar to the refrigeration system 150 and thus only those features which are reasonably necessary for a complete understanding of the third embodiment is described hereinbelow. One difference from refrigeration system 150 is that refrigeration system 250 may include either a PLC or a solid state temperature controller 260. However, for purposes of simplicity, the PLC or solid temperature controller 260 will be referred to herein as a PLC. As also seen in FIG. 5, the refrigerant line 20 is split such that an auxiliary refrigerant line 230 may divert at least a portion of the refrigerant directly to the evaporators 12–18 without allowing the diverted portion of the refrigerant to flow through the condenser 36. Because the diverted portion of the refrigerant does not flow through the either the condenser 36 nor the evaporator valve 42, the refrigerant in the auxiliary refrigerant line 230 has a considerably higher temperature than the refrigerant flowing from the evaporator valve 42 to the evaporators 12–18.

A main valve 240 is provided along the auxiliary refrigerant line 230 to control the amount of diverted refrigerant flowing into the evaporators 12–18. The main valve 240 may include a controllable metering valve similar to the evaporator valves 52–58. Additionally, the main valve 240 is controlled by the PLC 260 via a main temperature signal control line 270. The auxiliary refrigerant line 230 is also divided into a plurality of evaporator lines 232–238 which allows for the diverted refrigerant to enter directly into each of the evaporators without flowing through the evaporator valves 52–58.

In addition, in a similar fashion to the second preferred embodiment, FIG. 5 depicts the processors 142–148 to be cooled and shows that each of the processors 142–148 is in communication with the PLC 260 via a first set of temperature signal lines 152–158 which are connected to the PLC via a second temperature line 170. In this respect, according to the principles of the embodiment illustrated in FIG. 5, the temperatures of the processors 142–148 may be directly relayed to the PLC 260. However, it is within the purview of the present invention that the temperature of the processors 142–148 may be measured by any reasonable means including the adjusted temperature measurement of a cold plate. Such a modification to the position temperature measurements are taken may be accomplished without deviating from the scope and spirit of the present invention.

Figure 6:
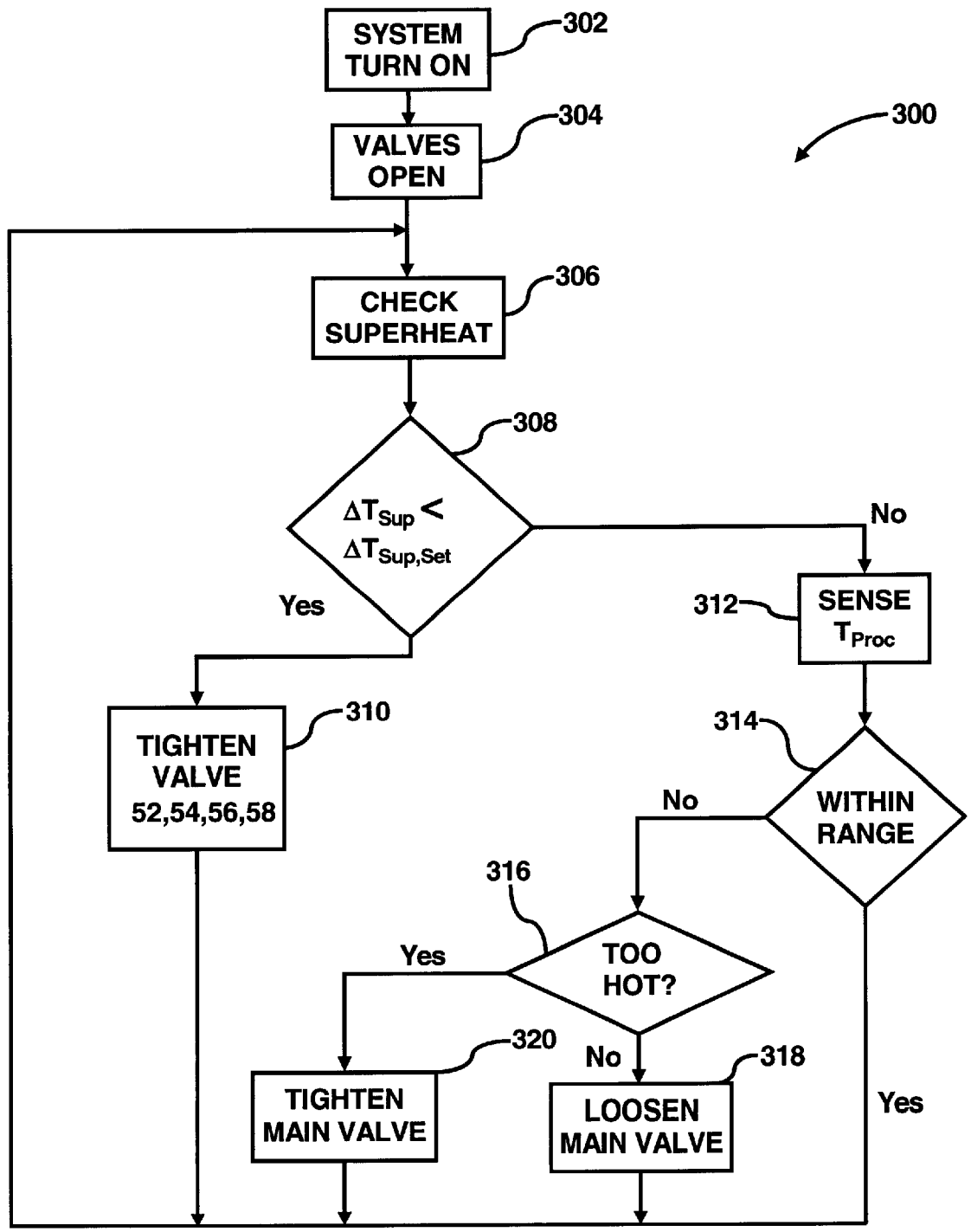
FIG. 6 is a flow chart depicting a manner in which the embodiment illustrated in FIG. 5 may be practiced.

FIG. 6 is a flow diagram 300 depicting a manner in which the embodiment illustrated in FIG. 5 may be practiced.

Accordingly, the following description of FIG. 6 will be made with particular reference to the features illustrated in FIG. 5. As seen in FIG. 5, after the refrigeration system 250 is turned on at 302, the evaporator valves 52–58 are opened at 304. As the refrigerant begins to flow through the refrigeration system 250, the $\Delta T_{sup}$ for each of the evaporators 12–18 is sensed by respective sensors 82–88 at step 306. At step 308, the $\Delta T_{sup}$ for each of the evaporators 12–18 is compared to a $\Delta T_{sup,set}$. The $\Delta T_{sup,set}$ for each of the evaporators 12–18 is about between 0–5° C. and may be set to be approximately the same for each of the evaporators.

For illustrative purposes only, example is made to one evaporator 12 and its related components. It is to be understood that each of the following steps are equally applicable to the other evaporators 14–18 and their related components, and that each of the following steps may be carried out simultaneously amongst all of the evaporators 12–18.

Thus, for example, if the $\Delta T_{sup}$ for the evaporator 12 is lower than the $\Delta T_{sup,set}$ for that evaporator, evaporator valve 52 is manipulated to decrease the mass flow rate of refrigerant therethrough by a controlled amount at step 310. The $\Delta T_{sup,set}$ may be determined in the manner discussed hereinabove with respect to the second embodiment. By decreasing the mass flow rate of the refrigerant through the evaporator 12, the $T_{sat}$ may be reduced, and the $\Delta T_{sup}$ may be increased, thus causing the $T_{proc}$ to be increased.

If, on the other hand, the $\Delta T_{sup}$ for the evaporator 12 is equal to or higher than the $\Delta T_{sup,set}$ for that evaporator, the $T_{proc}$ is sensed (e.g., with a diode, temperature resistor placed in the silicon, etc.) at 312. The temperature of the processor 142 is relayed to the PLC 260 via temperature signal lines 152 and 170. It is then determined whether the $T_{proc}$ is within a predetermined processor temperature range at step 314. The predetermined temperature processor range is determined based upon system design and the amount of load variability expected among the processors. In general, the predetermined range may depend upon the following: electrical timing requirements, allowable mechanical stress due to thermal expansion, proximity to dew point, etc. If the $T_{proc}$ is within the predetermined range, the mass flow rate of refrigerant flowing through the evaporator valve 52 is unchanged and the superheat is checked again at step 306.

If, on the other hand, the $T_{proc}$ is not within the predetermined processor temperature range, the $T_{proc}$ is compared to a set point processor temperature to determine whether the $T_{proc}$ is too hot at step 316. The set point processor temperature is a preferable operating temperature of the component and is generally provided by the component manufacturer. The preferable operating temperature is normally determined based upon the wafer manufacturing process, yield, frequency, etc. If the $T_{proc}$ is not too hot, then the main valve 240 is manipulated to increase the mass flow rate of refrigerant (which has not undergone a reduction in temperature or a change in phase) therethrough by a controlled amount at step 318. By increasing the mass flow rate of the refrigerant (which has not undergone a reduction in temperature or a change in phase) flowing into the evaporator 12, the evaporator inlet temperature of the refrigerant is increased, such that the $T_{proc}$ and the $\Delta T_{sup}$ may also be increased. If the $T_{proc}$ is too hot, the main valve 240 is manipulated to decrease the mass flow rate of the refrigerant (which has not undergone a reduction in temperature or a change in phase) by a controlled amount at step 320. By reducing this mass flow rate in this manner, the temperature of the refrigerant entering the evaporator 12 may be reduced, such that the $T_{proc}$ and the $\Delta T_{sup}$ may also be decreased.

According to the principles of the third embodiment of the present invention, the amount of refrigerant flowing into each of the evaporators 12–18 may be independently metered by the evaporator valves 52–58. Additionally, refrigerant which has not undergone reduction in temperature in the expansion valve 42 may be inserted directly into the evaporators 12–18 to thus heat the evaporators. Inserting refrigerant which has not undergone a reduction in temperature or a change in phase into the evaporators 12–18 may be necessary in the event that at least one of the processors 142–148 is not producing sufficient heat to cause sufficient superheat of the refrigerant. In the event that any of the processors 142–148 is not producing sufficient heat, as discussed hereinabove, the main valve 240 is manipulated to increase the mass flow rate of the refrigerant which has not undergone a reduction in temperature or a change in phase to thereby allow the heated refrigerant to enter directly into all of the evaporators 12–18.

However, in order to maintain the temperature of the processors that are producing sufficient heat, the evaporator valves 52–58 of those evaporators 12–18 may be further manipulated to compensate for the increased temperature of the refrigerant entering into those evaporators. Accordingly, the amount of refrigerant (which has not undergone a reduction in temperature) flowing through the auxiliary refrigerant line 230 into each of the evaporators need not be independently metered for each evaporator 12–18.

Although specific reference has been made to processors throughout the present disclosure, it is to be understood that the present invention may be practiced with any heat dissipating component in a computer.

What has been described and illustrated herein are preferred embodiments of the invention along with some of their variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A refrigeration system for cooling a plurality of components in a computer system, said refrigeration system comprising:

a variable speed compressor for controlling the flow of refrigerant through a refrigerant line;

an expansion valve located generally downstream of said compressor along said refrigerant line;

a plurality of evaporators, each said evaporator being configured to receive said refrigerant line and configured for thermal attachment to a respective component; and a plurality of valves located between said expansion valve and said plurality of evaporators along said refrigerant line, wherein said flow of said refrigerant into each of said evaporators is independently metered by a respective one of said plurality of valves.

2. The refrigeration system of claim 1, wherein said refrigerant line is divided into a plurality of second refrigerant lines upstream of said evaporators and wherein each of said plurality of second refrigerant lines is configured to deliver said refrigerant into a respective evaporator.

3. The refrigeration system of claim 1, further comprising a proportional, integral, derivative controller including an input line from a sensor located upstream of said plurality of second refrigerant lines and an output line connected to said compressor, wherein said proportional, integral, derivative controller is capable of sending signals to said variable speed compressor to vary the mass flow rate and saturation temperature of said refrigerant in response to a saturation temperature measurement of said refrigerant by said sensor.

4. The refrigeration system of claim 3, further comprising a plurality of second sensors positioned along each of said plurality of refrigerant lines and generally downstream of each of said evaporators, each said second sensor being capable of sending signals to said respective valve positioned on said second refrigerant line to thereby meter the amount of refrigerant entering into each said evaporator.

5. The refrigeration system of claim 1, further comprising a plurality of refrigerant lines extending downstream of said evaporators, wherein said plurality of refrigerant lines converge into a single refrigerant line upstream of said compressor.

6. The refrigeration system of claim 5, further comprising a sensor configured to measure a suction temperature located in said single refrigerant line upstream of said compressor.

7. The refrigeration system of claim 1, wherein said variable speed compressor is configured to vary the mass flow rate of said refrigerant through said refrigerant line.

8. A method for cooling multiple components of a computer system having multiple fluctuating heat loads, said method comprising:

controlling a flow of a refrigerant through a refrigerant line in a refrigeration system having a variable speed compressor and an expansion valve, said refrigeration system further including a plurality of evaporators and a plurality of valves, each of said valves being configured to meter said flow of said refrigerant through a respective evaporator; and varying the amount of refrigerant delivered to each of said plurality of evaporators.

9. The method according to claim 8, wherein said step of varying the amount of refrigerant is based upon detected superheat temperatures of the refrigerant exiting each evaporator.

10. The method according to claim 8, wherein said varying step comprises:

sensing a saturation temperature of said refrigerant; and modifying a speed of said compressor in response to said saturation temperature being outside a predetermined saturation temperature range.

11. The method according to claim 10, further comprising:

increasing the speed of said compressor in response to the saturation temperature exceeding a saturation temperature set point.

12. The method according to claim 10, further comprising:

sensing a superheat temperature of said refrigerant exiting from each of said evaporators in response to said saturation temperature being within said predetermined saturation temperature range.

13. The method according to claim 12, further comprising:

manipulating said valve to decrease the flow of refrigerant through a respective evaporator for each of said evaporators in which said superheat temperature of said exiting refrigerant is outside the predetermined superheat temperature range and said superheat temperature of said exiting refrigerant is less than an evaporator superheat temperature set point for each said respective evaporator.

14. The method according to claim 12, further comprising:

manipulating said valve to increase the flow of refrigerant through a respective evaporator for each of said evaporators in which said superheat temperature of said refrigerant is outside said predetermined superheat temperature range and said superheat temperature of said refrigerant exceeds or is equal to said evaporator superheat temperature set point for each said respective evaporator.

15. The method according to claim 10, further comprising:

decreasing the speed of said compressor in response to the saturation temperature being below a saturation temperature set point.

16. The method according to claim 8, further comprising:

varying the amount of refrigerant delivered to each of said plurality of evaporators to maintain said components at substantially similar temperatures.

17. A system for cooling a plurality of components in an electronic system, said system comprising:

means for varying the flow rate of a refrigerant through a refrigerant line;

means for varying the pressure of the refrigerant; and means for individually metering the flow of said refrigerant through a plurality of evaporators, each of said evaporators being thermally attached to at least one of said plurality of components, to cool at least one of said plurality of components.

18. The system according to claim 17, wherein said metering means comprises means for substantially simultaneously metering the flow of said refrigerant through each of said evaporators.

19. The system according to claim 17, further comprising means for controlling the flow rate variation of said refrigerant in response to a detected saturation temperature of said refrigerant.

20. The system according to claim 17, further comprising:

means for maintaining said components at substantially similar temperatures.

21. The system according to claim 20, wherein said maintaining means comprises means for varying the refrigerant input into each evaporator.

* * * * *